(12) United States Patent
Luo et al.

(10) Patent No.: US 9,490,667 B2
(45) Date of Patent: Nov. 8, 2016

(54) APPARATUS AND SYSTEM FOR ATTACHING INTEGRAL SPACERS TO LAMINATIONS

(71) Applicant: General Electric Company, Schenectady, NY (US)

(72) Inventors: Yuefeng Luo, Mechanicville, NY (US); William Edward Adis, Scotia, NY (US); David Norwood Dorsey, Clifton Park, NY (US); Christopher Richardson, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 599 days.

(21) Appl. No.: 13/948,733

(22) Filed: Jul. 23, 2013

(65) Prior Publication Data

US 2015/0028717 A1   Jan. 29, 2015

(51) Int. Cl.
| | |
|---|---|
| *H02K 1/12* | (2006.01) |
| *G06F 17/50* | (2006.01) |
| *H02K 1/16* | (2006.01) |
| *H02K 15/02* | (2006.01) |
| *H02K 1/02* | (2006.01) |
| *H02K 1/04* | (2006.01) |

(52) U.S. Cl.
CPC ............ *H02K 1/12* (2013.01); *G06F 17/5086* (2013.01); *H02K 1/16* (2013.01); *H02K 15/024* (2013.01); *H02K 1/02* (2013.01); *H02K 1/04* (2013.01); *H02K 2213/12* (2013.01)

(58) Field of Classification Search
CPC ............ H02K 1/02; H02K 1/04; H02K 1/12; H02K 1/16; H02K 15/024; H02K 2213/12; G06F 17/50; G06F 17/5086
USPC .............................. 310/58, 216.054; 700/97
IPC ................................... H02K 1/12; G06F 17/50
See application file for complete search history.

(56) References Cited

U.S. PATENT DOCUMENTS

| | | | | |
|---|---|---|---|---|
| 4,710,085 | A | * 12/1987 | Beakes | ............... B65G 59/063 221/297 |
| 2002/0070621 | A1 | * 6/2002 | Mori | ........................ H02K 3/30 310/215 |
| 2008/0072415 | A1 | * 3/2008 | Koshizaka | ............... H02K 1/16 29/527.7 |
| 2015/0028717 | A1 | * 1/2015 | Luo | .......................... H02K 1/16 310/216.054 |

* cited by examiner

*Primary Examiner* — John K Kim
(74) *Attorney, Agent, or Firm* — Ernest G. Cusick; Frank A. Landgraff

(57) ABSTRACT

Disclosed are methods, apparatuses, and systems with regard to laminations. In an embodiment, an apparatus includes a lamination having a variable thickness and a spacer connected with the lamination at a location, wherein the location of the spacer is based on a determined thickness of the lamination.

10 Claims, 12 Drawing Sheets

APPARATUS AND SYSTEM FOR ATTACHING INTEGRAL SPACERS TO LAMINATIONS

TECHNICAL FIELD

The technical field generally relates to stator cores of power generator and more specifically laminations for stator cores of power generator.

BACKGROUND OF THE INVENTION

In all types of stator construction, the central iron core is constructed from thin coated steel laminations stacked together. By making the coated laminations very thin the resistivity of the steel sheet itself is high and surface insulation of laminations is complete, reducing the eddy current losses through the core. These steel laminations vary in thicknesses from between 0.2 mm to 0.5 mm. The laminations are electrically insulated from each other by a very thin coating of insulating varnish or the like.

BRIEF DESCRIPTION OF THE INVENTION

Disclosed herein are systems and apparatus with regard to laminations. In an embodiment, an apparatus comprises a lamination having a variable thickness and a spacer connected with the lamination at a location, wherein the location of the spacer is based on a determined thickness of the lamination.

In an embodiment, a stator core comprises a plurality of laminations, the plurality of laminations are substantially all of the laminations found in the stator core, wherein each lamination of the plurality of laminations has an integral spacer.

In an embodiment, a system may include a processor and a memory coupled to the processor, the memory having stored thereon executable instructions that when executed by the processor cause the processor to effectuate operations. The operations may include providing instructions to determine a thickness at a location on a lamination, the lamination having a variable thickness and providing instructions to add a spacer of a first thickness at the location on the lamination based on the determined thickness of the lamination at the location.

This Brief Description of the Invention is provided to introduce a selection of concepts in a simplified form that are further described below in the Detailed Description. This Brief Description of the Invention is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying drawings wherein.

DETAILED DESCRIPTION OF THE INVENTION

Figure 1:
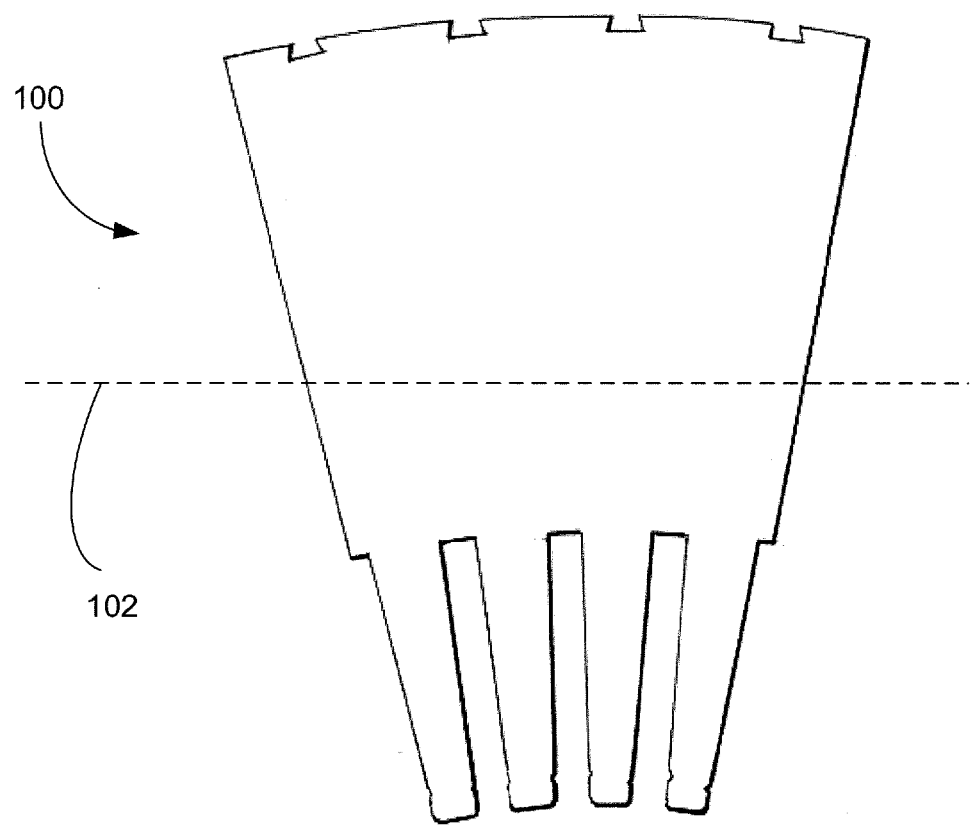
FIG. 1 displays a front view of a lamination.
Figure 2:
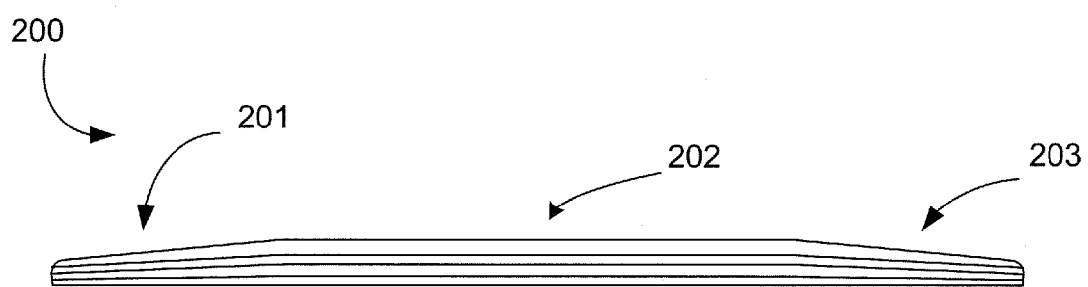
FIG. 2 displays a stack of laminations with exaggerated thickness imperfections.

FIG. 1 displays a front view of a thin lamination 100 that may be used in generator core construction. A lamination often has thickness imperfections that make it thicker in the middle, for example near line 102, than on both ends. The thickness imperfections may be the result of materials not adequately flowing out to sides and edges of the original steel sheet, even under high roller pressure. Steel billets are rolled into thin steel sheet and then coiled in the mill plant. When many layers are stacked, the thickness imperfection may cause the stacked core being formed from successive layers of the laminations to incur a parallelism error (i.e., "crowning"), as shown in FIG. 2. This parallelism error occurs because in stacking the laminations, the relatively thicker portions of the laminations directly overlay one another, and the relatively thinner portions of the laminations directly overlay one another. For example, in FIG. 2, after the stacking of the individual laminations, the middle portion 202 of stack 200 becomes higher than the edges at 201 and 203, which in turn results in a crowning of stack 200. Currently, in order to correct the parallelism error, a manual process of shimming a spacer is done after stacking several laminations, which may be in the tens or hundreds of laminations.

Figure 3:
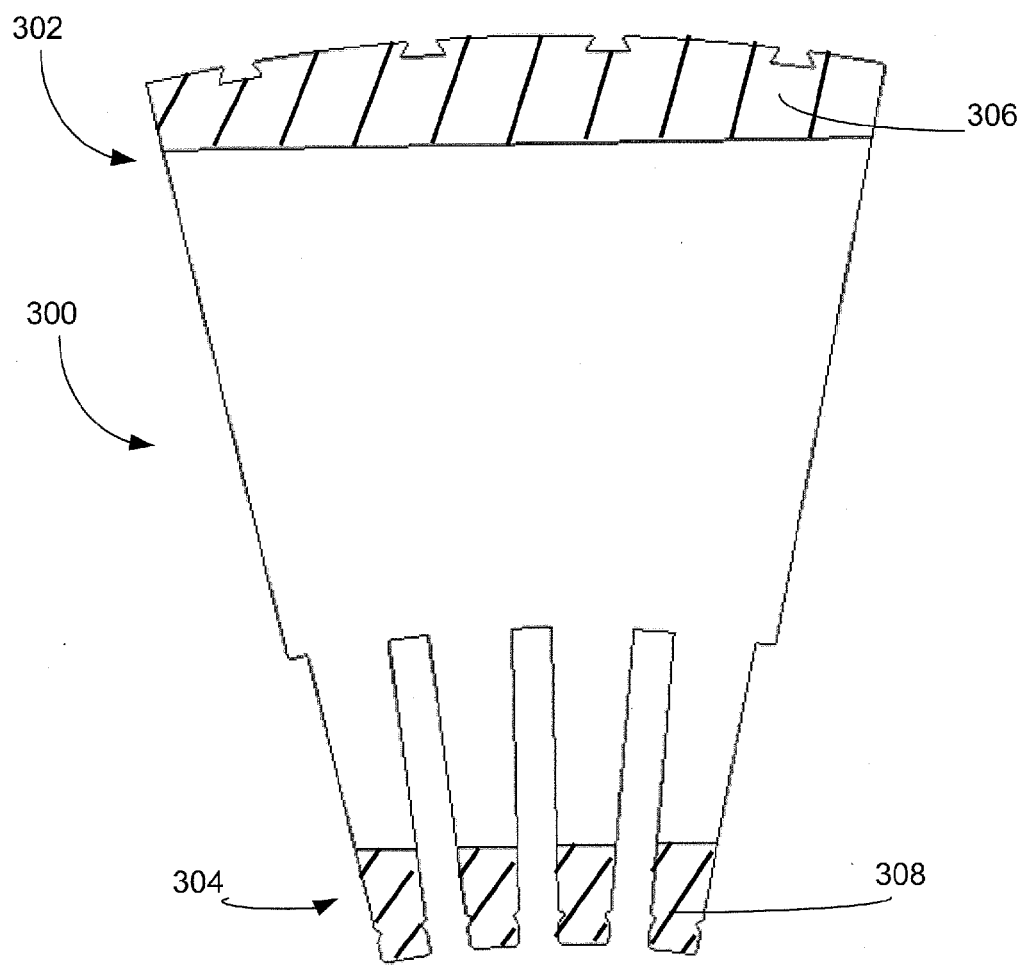
FIG. 3 displays a front view of a lamination with continuous integral spacers.
Figure 4:
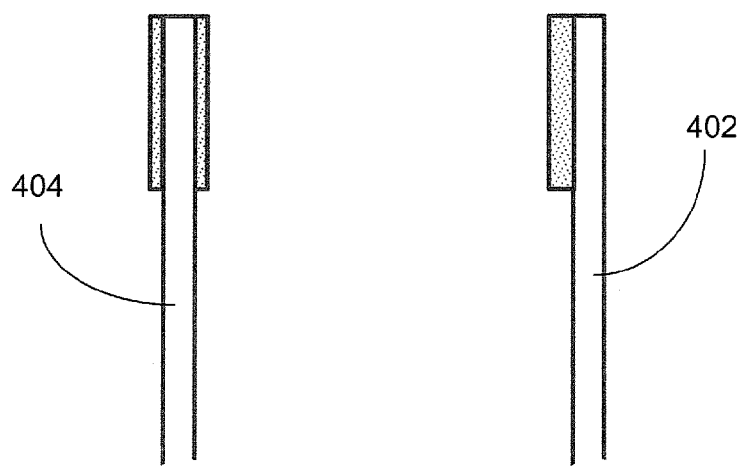
FIG. 4 displays a close up side view of a portion of two laminations with exaggerated integral spacers.

FIG. 3 shows continuous integral end spacer 306 and integral end spacer 308 attached to dovetail end 302 and tooth end 304 of a lamination 300 to offset the parallelism error. The inclusion of integral spacers with each lamination that creates a generator core allows for a stable stack or core under flange compression. FIG. 4 displays close-up side views of portions of laminations. Lamination 402 and lamination 404 have an attached integral end spacer. The integral spacer may include a substance that comprises one of a thick film coating, partial varnish coating, an attached direct sheet, or adhesive tapes. The spacer substance may be applied to the spacer areas of a steel sheet and then punched into laminations with spacers on a single side (e.g., lamination 402) or both sides (e.g., lamination 404).

The lamination may be coated with insulation varnish or the like. A flange may be used to compress the laminations with the integral spacers in stacking. In an embodiment, integral spacers, as discussed herein, may be designed to be slightly thicker than what would make a single lamination look level in thickness, for example, to account for shrinking under different compression to level the crown. The higher spacers shrink more under more pressure, while the crown shrinks much less even under the highest pressure.

In an embodiment, the crown height may vary around an average value, e.g. 0.5 mil. For an individual lamination, the crown height can be slightly different from the spacer height. In some areas a spacer of a lamination may be higher than the crown, while in other areas the spacer height may be lower than the crown. On average, the spacer height may be equal to the crown height. When many laminations are stacked, the entire stack does not display a crown. The spacer material may be softer than the mill coating and precoating. The softer spacer shrinks under compression to level with the middle crown. The middle crown made of stiffer mill coating, precoating, and steel barely shrinks. If the spacer is slightly higher, e.g. 0.55 mil on average, than the crown, e.g., 0.5 mil on average, each individual layer may level better under compression. The above techniques may allow canceling the variable crown without tracking the random crown variations. In another embodiment, the crown height variation can be tracked (per lamination or the entire stack) and spacer thickness/height may be adjusted accordingly. In another embodiment, the spacer may have the same thickness or height, e.g. 0.5 mil, which would match an expected average height for a crown of each lamination, e.g., 0.5 mil.

Figure 5:
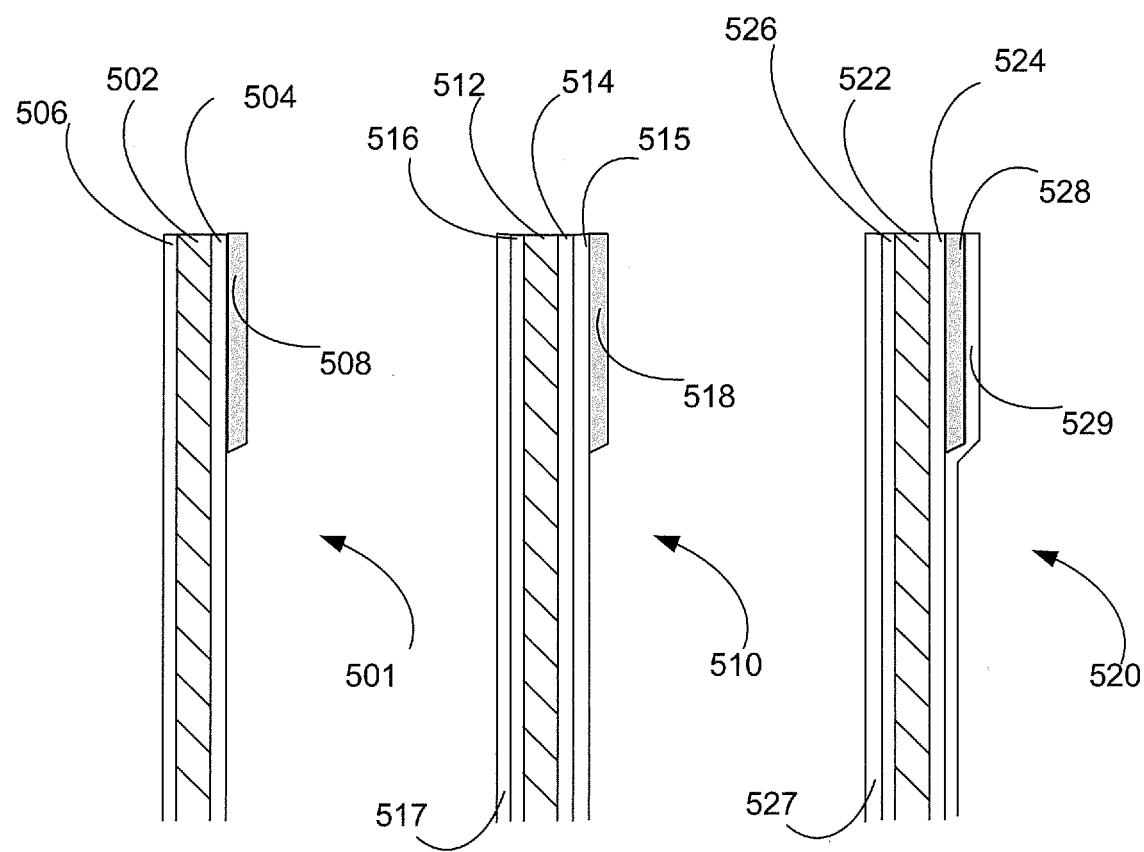
FIG. 5 displays close-up side views of portions of laminations and coating configuration.

Laminations may be punched along a steel coil. The steel coil may be coated with insulation such as precoat and mill coat. Spacers in both sides may be coated or taped before punching. After punching, the lamination can be recoated. Spacers can also be applied before recoat or after recoat. FIG. 5 displays different coating and spacer configurations. Lamination 501 has steel 502, top precoat 504, bottom precoat 506 and an integral spacer 508. Lamination 510 has steel 512, top precoat 514, recoat 515, bottom precoat 516, bottom recoat 517, and integral spacer 518. Lamination 520 has steel 522, top precoat 524, bottom precoat 526, integral spacer 528, and top recoat 529, and bottom recoat 527. The aforementioned coating and spacer configurations are contemplated for laminations with integral spacers on both sides. The precoats may consist of single or multiple layers including mill coatings. The recoat may consist of single or multiple layers.

Figure 6:
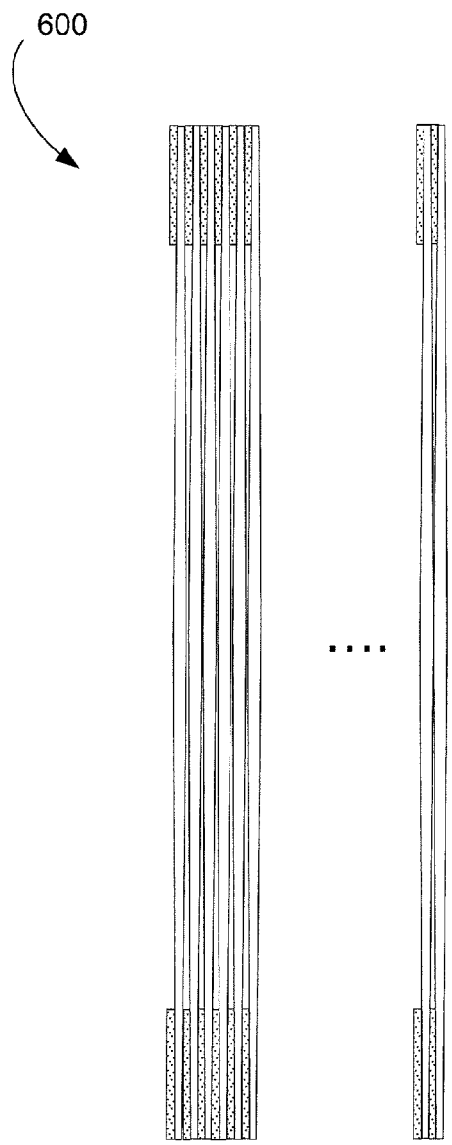
FIG. 6 displays an exemplary stack of laminations with integral spacers on each lamination.
Figure 7:
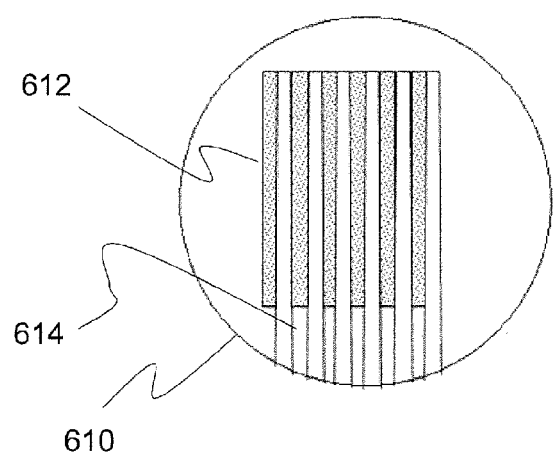
FIG. 7 displays close up view of laminations with integral spacers displayed in FIG. 6.

FIG. 6 displays an exemplary stack of laminations 600 with integral end spacers on each lamination. The spacers, which are usually much thinner than the steel layer, is exaggerated in FIG. 6 and FIG. 7. FIG. 7 displays close up view of laminations 600 with integral end spacers displayed in FIG. 6. A close up view 610 of 600 shows end spacer 612 and a cooling gap 614. As shown in FIG. 7, cooling gaps exist between the middle crown and end spacers. A gap of about 5-25 micrometers allows natural convection between two adjacent layers especially when the teeth are hot in generator operation. The end spacers may increase insulation to critical areas, such as tooth edges, where interlaminar voltage is the highest. Insulation thickness may be increased by three to six times at tooth edges. The added spacers may also increase the tolerance to dings of the tooth edges. In addition, a layer of insulating magnetic particles as part of the end spacer, may increase the core permeability at the tooth ends, where magnetic flux is usually the strongest.

Figure 8:
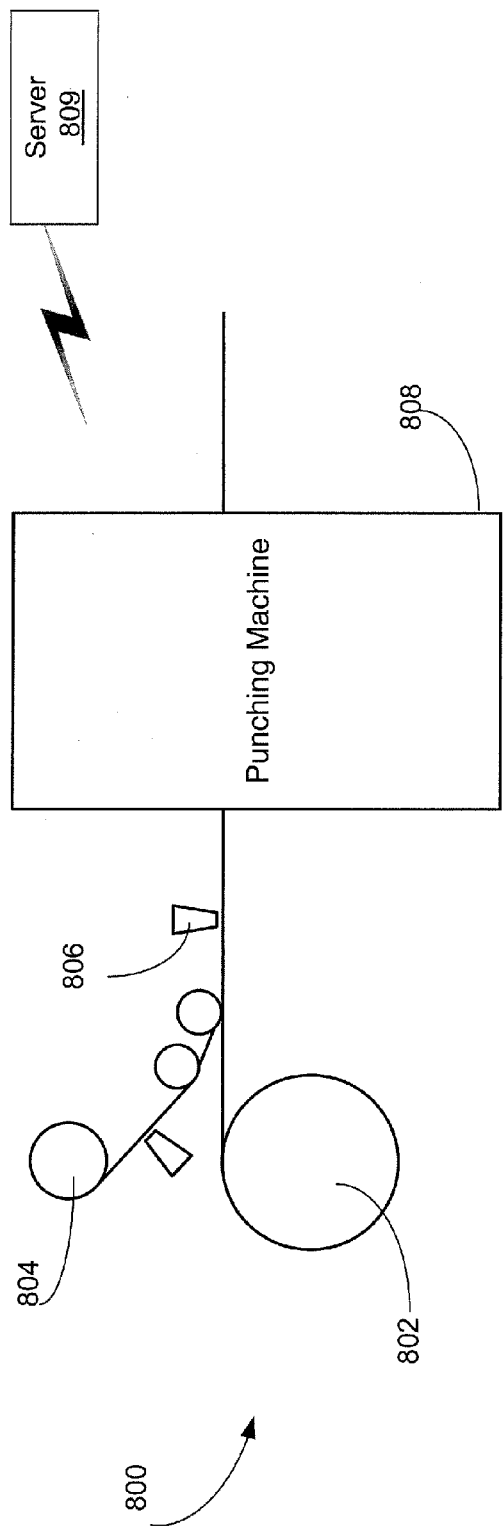
FIG. 8 is a block diagram of a side view of a system that attaches integral spacers.
Figure 9:
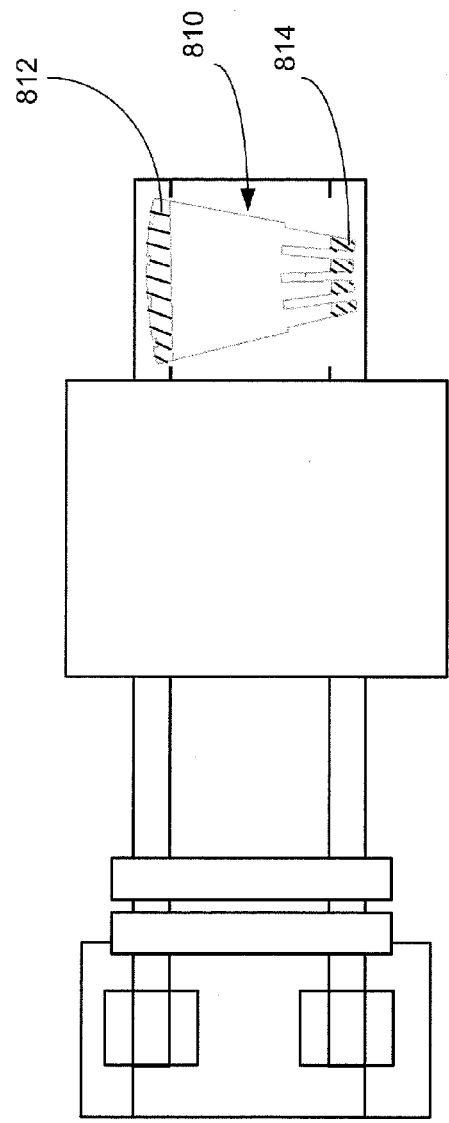
FIG. 9 is a block diagram of a top view of an exemplary system that attaches integral spacers.

FIG. 8 is a block diagram of a side view of an exemplary system 800 that may attach adhesive tape used as an integral spacer. FIG. 9 is a block diagram of a top view of exemplary system 800 that attaches adhesive tape. FIG. 8 displays a steel roll 802 (e.g., grain oriented or non-grain oriented steel) and an adhesive tape roll 804. System 800 may also comprise a punching machine 808 that punches a thin sheet of steel into a lamination 810, which is shown in FIG. 9. The devices (e.g., punching machine, etc.) in system 800 may be communicatively connected to a server 809 or other computing device that provides instructions to devices in system 800 to perform operations consistent with creating laminations and/or integral spacers. The tapes from roll 804 may be made with high temperature (e.g., withstand at least 100 degrees Celsius) polyester, or other high temperature polymers, with a silicone adhesive back. Tapes without adhesive back may be attached by applying inline adhesive and heating via a heater 806, as shown in system 800. After tape is attached to both coil ends, the composite sheet may enter punching machine 808 to output lamination 810 with attached adhesive tape (integral spacer). The adhesive tape integral spacers found on lamination 810 are continuous and cover the critical end edges, the dovetail 812 and teeth 814 (also called fingers) of lamination 810. In an embodiment, the adhesive tape spacers may be attached after the steel thin sheet is punched (i.e., after the lamination is created). The taping and punching process may be separated rather than continuous as shown. First the material is uncoiled, taped, and recoiled. The taped coil is then uncoiled and punched to create laminations to be collected.

Figure 10:
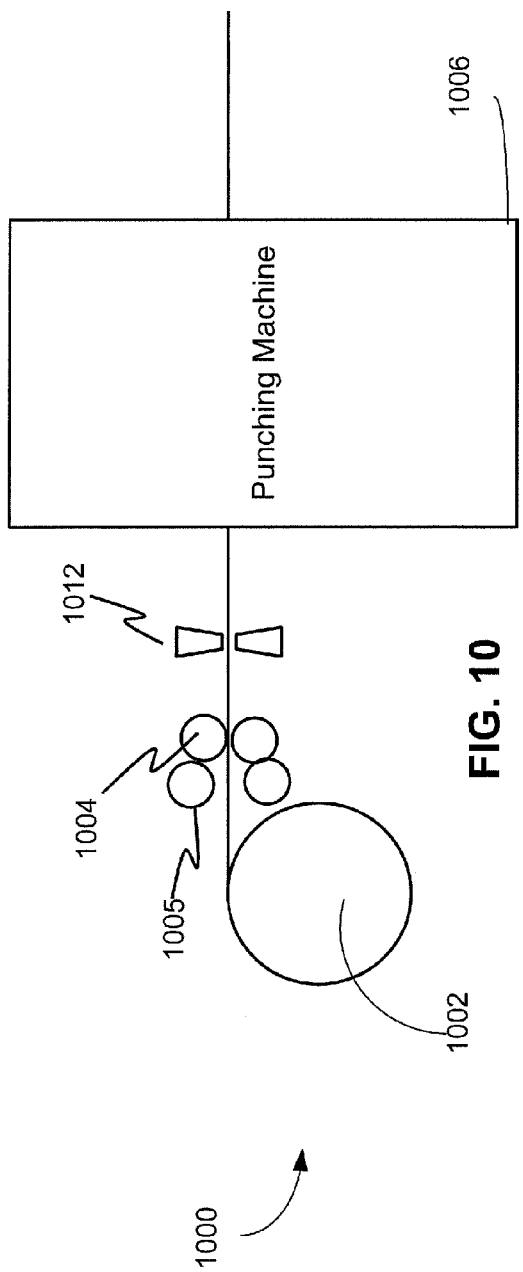
FIG. 10 is a block diagram of a side view of a system that attaches integral spacers.
Figure 11:
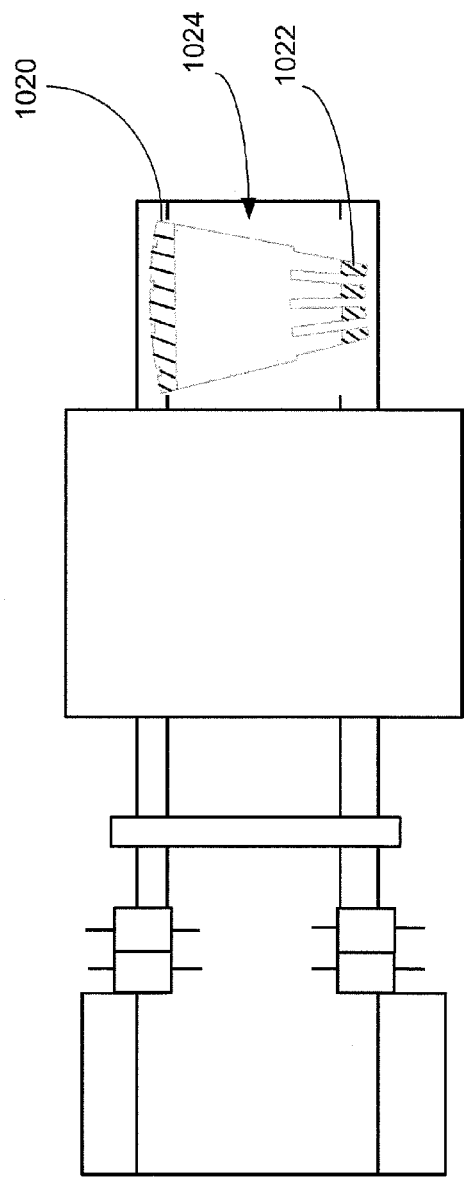
FIG. 11 is a block diagram of a top view of a system that attaches integral spacers.

FIG. 10 is a block diagram of a side view of an exemplary system 1000 that may attach enamel resin as an integral spacer. FIG. 11 is a block diagram of a top view of exemplary system 1000 that attaches enamel resin. As shown FIG. 10, system 1000, may apply enamel resin to sheets from metal coil 1002 by using a group of rollers that include roller 1004 and roller 1005. The enamel resin may be applied to the metal sheet before being punched by punching machine 1006. The enamel resin may be of C-3 organic type or C-6 organic enamel with solid filler. Other lamination coatings may also be used. Thin coatings may be applied on both top and bottom sides to give adequate thickness to offset the parallelism error. After resin is applied to both coil sides, the coil ends may be heated via a group of heaters 1012 to cure the enamel resin. The enamel resin integral spacers found on lamination 1024 cover the critical end edges of the dovetail 1020 and teeth 1022 of lamination 1024. In an embodiment, the enamel resin integral spacers may be attached after the thin metal sheet is punched (i.e., after a lamination is created). The coating can be applied on one side of the sheet if the crown size is small. The coating and punching process may be separated rather than continuous as shown. First the material may be uncoiled, coated, and recoiled. The partially coated coil is then uncoiled and punched to create laminations to be collected.

Figure 12:
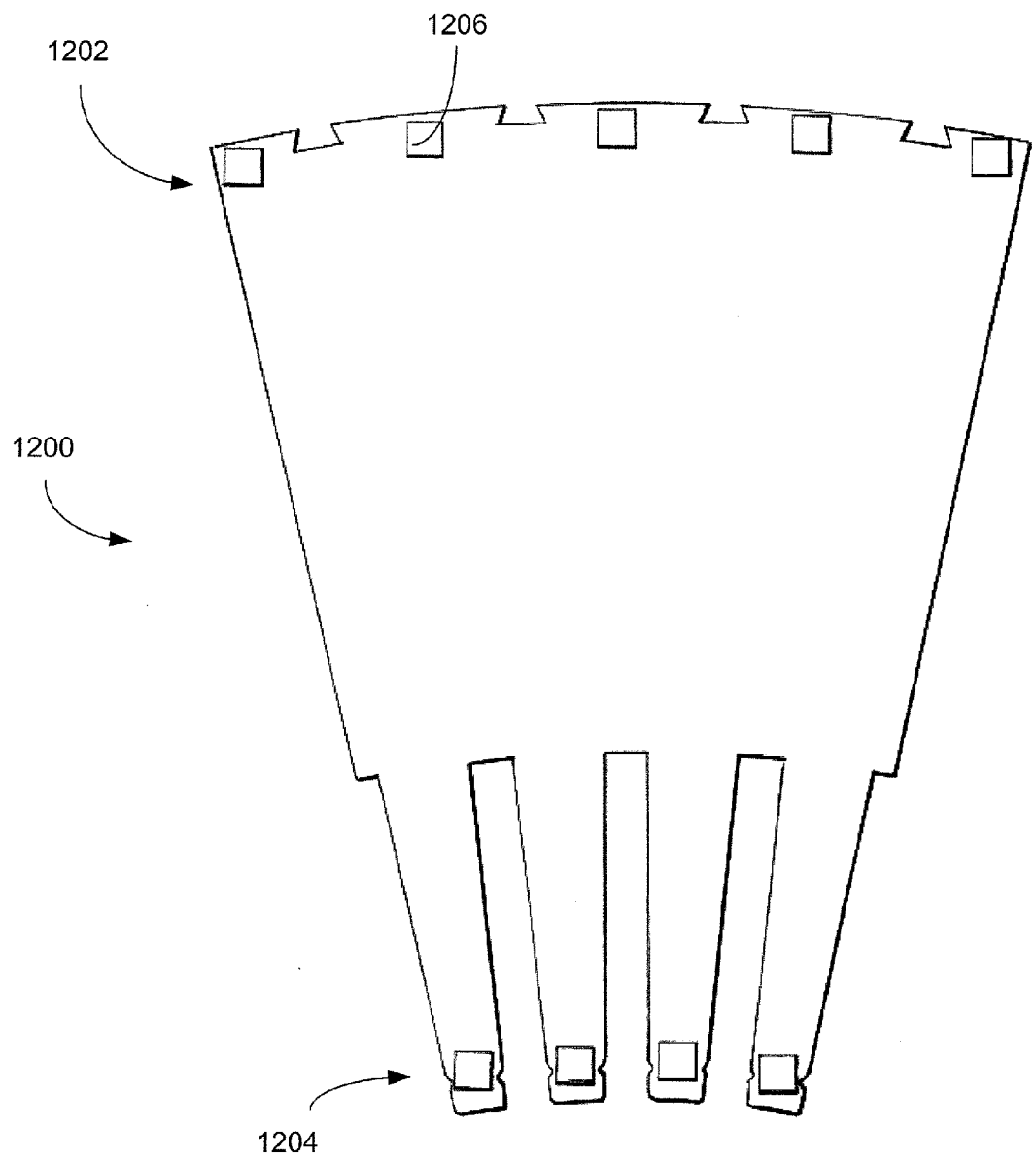
FIG. 12 displays an embodiment of lamination with an integral spacer comprising individual insulation pads.
Figure 13:
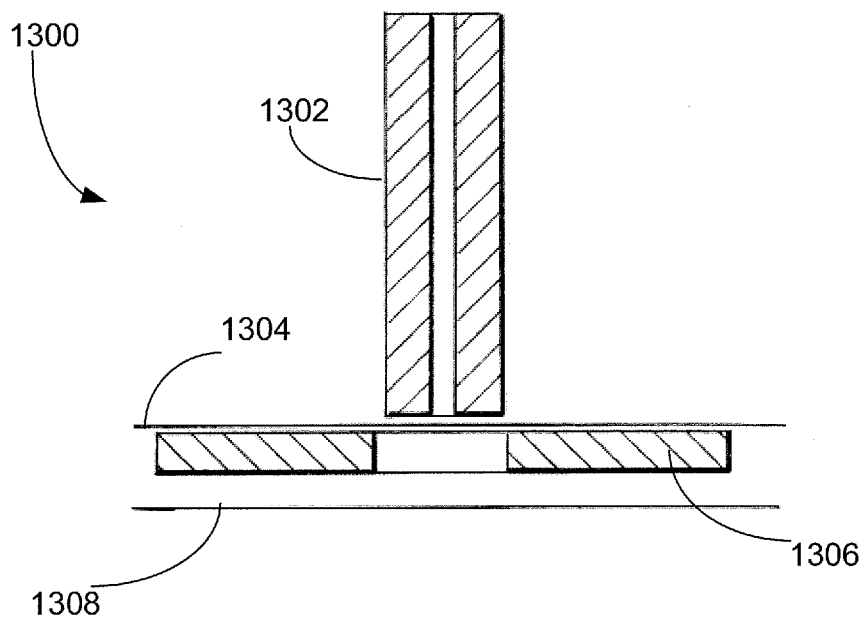
FIG. 13 displays a cross section of a system that attaches integral spacers when a tap is not punched.
Figure 14:
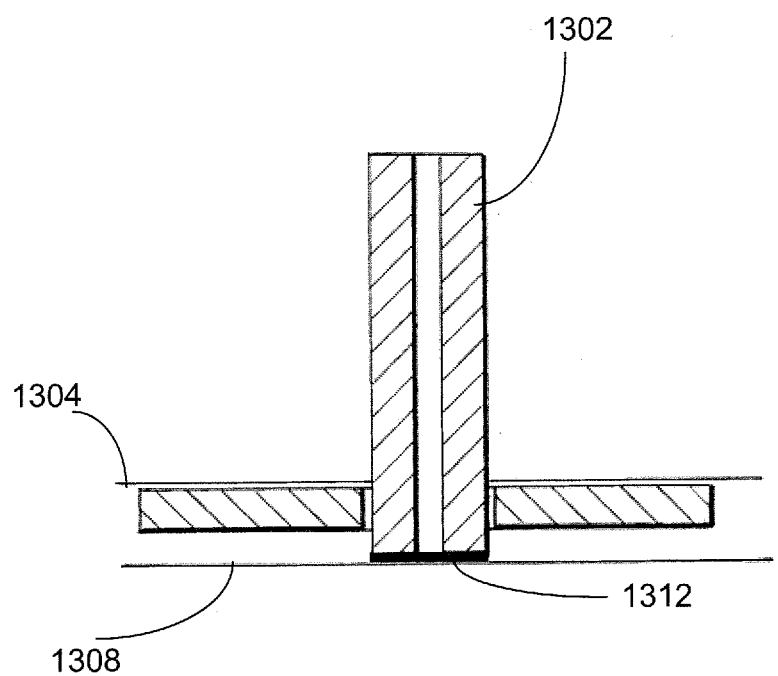
FIG. 14 displays a cross section of a system that attaches integral spacers when a tape is punched.

FIG. 12 displays an embodiment of lamination 1200 with an integral spacer that has individual insulation pads (e.g., pad 1206) that may be applied to the dovetail 1202 and teeth end 1204 of lamination 1200. After the application of enamel resin for the recoat, but before high temperature curing, individual pads may be applied to the still wet surface of the lamination 1200. Polymer tapes from rolls may supply the material continuously to a designated pad location. FIG. 13 and FIG. 14 display a cross section of an exemplary system 1300 to stamp and attach the aforementioned pads. In an embodiment, there may be a punch 1302 and a die plate 1306. A polymer tape 1304 may be placed over the die plate 1306 and under the punch 1302, as shown in FIG. 13. A lamination 1308 may be located in a manner to receive polymer tape 1304 when punched. FIG. 14 displays tape 1304 punched into pad 1312. Pad 1312 may be placed on a wet surface of lamination 1308. After pad 1312 sticks to the enamel surface of lamination 1308, heating power from an oven or infrared irradiation may be applied to cure the enamel with pad 1312. Tape with an adhesive back may be similarly applied on a dry lamination surface after the enamel is cured, for example.

Figure 15:
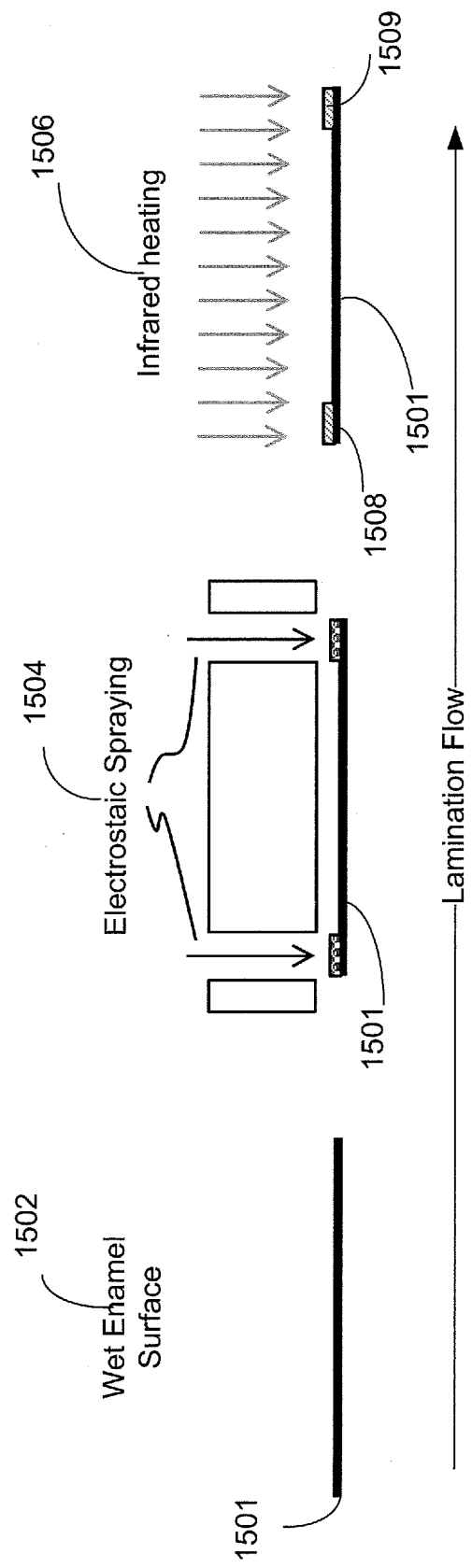
FIG. 15 displays a side view of an exemplary process for powder deposition and curing to create a lamination with integral spacers.

FIG. 15 displays a side view of an exemplary process for powder deposition and curing to form end spacers 1508 and 1509 for lamination 1501. Enamel resin is applied to the surface of lamination 1501 first at 1502; the enamel doesn't get heated right away. At 1504, polymer and/or ceramic powders may be applied to the wet surface of the lamination 1501 by electrostatic spraying or other spraying methods. The amount of deposited material depends on spraying time and flow density. At 1506, infrared, ultraviolet, or oven heating may be applied to cure the integral spacers 1508 and 1509 as well as the wet enamel surface of lamination 1501.

Figure 16:
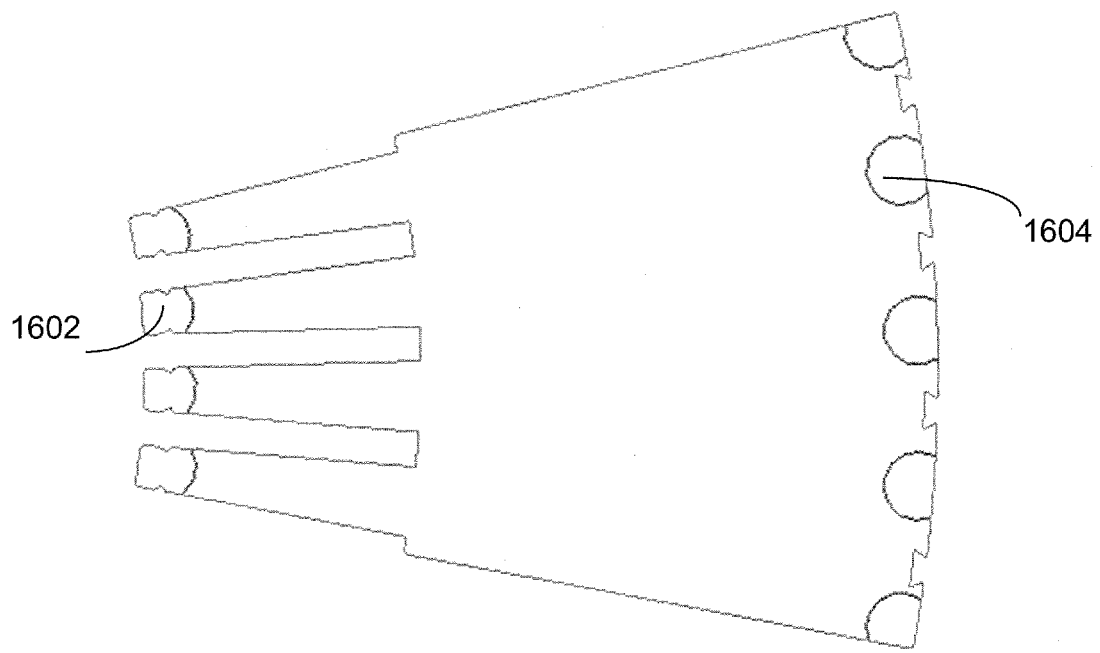
FIG. 16 displays a front view of a lamination with separated integral spacers.
Figure 17:
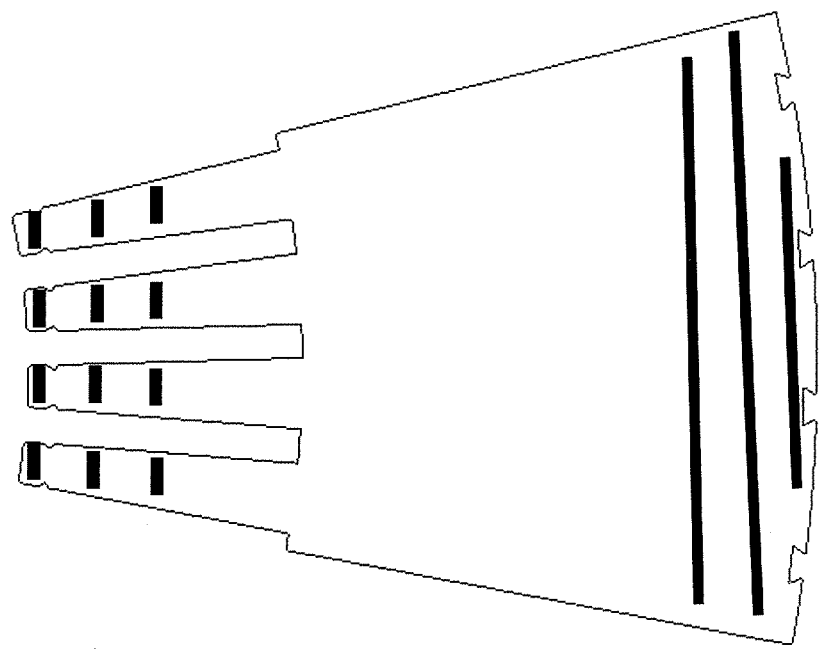
FIG. 17 displays a front view of a lamination with individual step stripe integral spacers.

Besides continuous integral end spacers as shown in FIG. 3, individual pads may also be placed on a lamination surface. After the application of enamel recoat over the mill coat or precoat, ceramic and/or polymer powders may be sprayed or printed to end locations within a limited scope, such as 1602 and 1604, as shown in FIG. 16. Wet enamel may not be cured when the powder is applied. Powder that falls off the edge of the lamination may be collected for later application. The scope of the powder application, as shown in FIG. 16 may cover the lamination end edges. FIG. 17 displays an embodiment of integral spacers which comprises individual step stripes that may have different heights to address the parallelism error step wise. There may be many different structural patterns of integral spacers. Generally integral spacers for each lamination, as discussed herein, offset the parallelism error on one or more lamination ends. Individual integral end spacers, such as FIG. 12 or FIG. 16, may also offset the parallelism error, but give more cooling gaps for convection flow.

Applicable polymeric materials for integral spacers as disclosed herein include high temperature polyester, polyurethane, phenolics (PF) or enamel, and polyimide. Applicable ceramic powder materials include alumina, zirconia, silicate, and the like. Applicable insulating magnetic materials for the powders include ferrites and the like.

Figure 18:
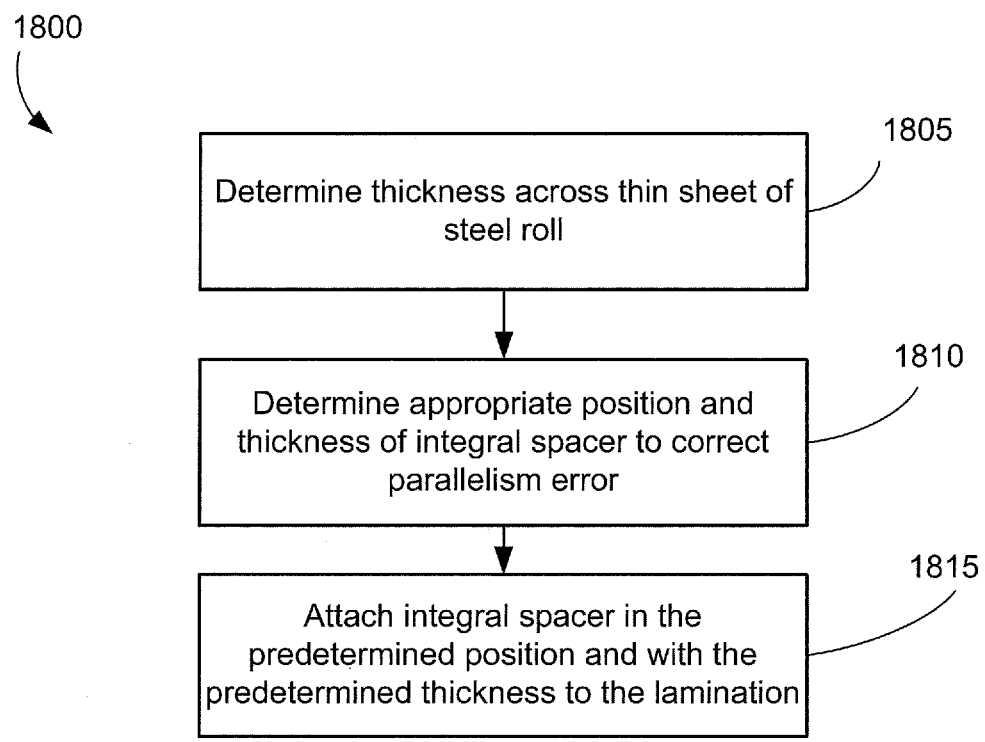
FIG. 18 illustrates a non-limiting exemplary method of creating an integral spacer.

FIG. 18 illustrates a non-limiting exemplary method of creating an integral spacer to correct or minimize the parallelism error. Method 1800 may be performed, at least in part, by computing equipment including servers, mobile devices, or another other device that can execute computing functions. In an embodiment at step 1805, thickness across a thin sheet of metal is determined. The thickness may be determined by measuring the thin sheet once or periodically (e.g., a periodic time period or roll length). The measurement may then be extrapolated throughout the application of the integral spacer to the thin sheet of a roll of metal. In an alternative embodiment, the thickness may be measured continuously.

At step 1810, after the thickness of the thin sheet is measured, the appropriate thickness and position of the integral spacer to correct the parallelism error is determined. The integral spacers may be made of material that is plastic or flexible and able to adjust to address the parallelism error while under pressure, so an acceptable tolerance range of thickness for the integral spacer may also be determined. At step 1815, the integral spacer of predetermined thickness and position is attached to the thin sheet. In other embodiments, the measurements and/or subsequent attachment of the spacer may be done before or after the lamination is created from a thin sheet of the steel roll. Afterwards the lamination with an integral spacer is stacked on top of another lamination with an integral spacer to eventually create a generator core.

In an embodiment, an integral spacer may be made of a constant thickness and placed on each lamination. Afterwards a measurement may be taken to determine how to adjust (e.g., file down) the integral spacer to the appropriate thickness for a consistent thickness across the length of the lamination.

Without in any way limiting the scope, interpretation, or application of the claims appearing herein, a technical effect of one or more of the example embodiments disclosed herein is to provide methods to correct the parallelism error that may occur when stacking several laminations (e.g., tens or hundreds of laminations). The prior art process interrupts stacking of laminations to shim or align every 2 to 3 inches, for example. The process disclosed herein may address the parallelism error as the laminations are being created. The disclosed process also provides additional insulation, cooling, permeability, plus the non-grain oriented (NGO) mechanical rigidity for higher power output. The disclosed methods also provide for strengthened core insulations at bar slots and tooth edges as well as offsets issues with edge dings that may happen during handling and punching. The laminations with integral spacers may be stacked consecutively and may be a substantial amount (e.g., fifty to one-hundred percent) of laminations in the stator core.

Figure 19:
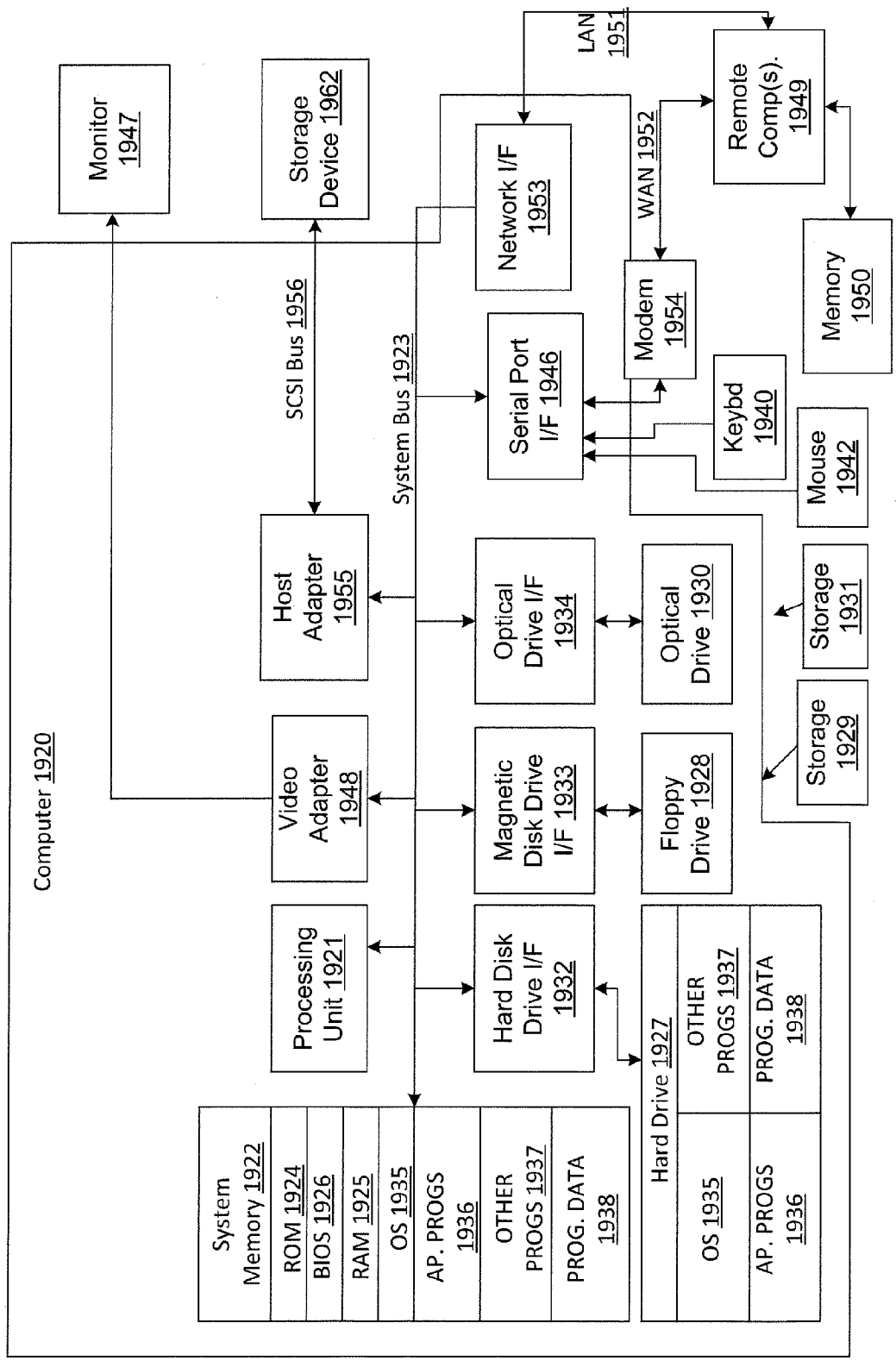
FIG. 19 is an exemplary block diagram representing a general purpose computer system in which aspects of the methods and systems disclosed herein or portions thereof may be incorporated.

FIG. 19 and the following discussion are intended to provide a brief general description of a suitable computing environment in which the methods and systems disclosed herein and/or portions thereof may be implemented. Although not required, the methods and systems disclosed may be described in the general context of computer-executable instructions, such as program modules, being executed by a computer, such as a client workstation, server or personal computer. Generally, program modules include routines, programs, objects, components, data structures and the like that perform particular tasks or implement particular abstract data types. Moreover, it should be appreciated the methods and systems disclosed herein and/or portions thereof may be practiced with other computer system configurations, including hand-held devices, multi-processor systems, microprocessor-based or programmable consumer electronics, network PCs, minicomputers, mainframe computers and the like. A processor may be implemented on a single-chip, multiple chips or multiple electrical components with different architectures. The methods and systems disclosed herein may also be practiced in distributed computing environments where tasks are performed by remote processing devices that are linked through a communications network. In a distributed computing environment, program modules may be located in both local and remote memory storage devices.

FIG. 19 is a block diagram representing a general purpose computer system in which aspects of the methods and systems disclosed herein and/or portions thereof may be incorporated. As shown, the exemplary general purpose computing system includes a computer 1920 or the like, including a processing unit 1921, a system memory 1922, and a system bus 1923 that couples various system components including the system memory to the processing unit 1921. The system bus 1923 may be any of several types of bus structures including a memory bus or memory controller, a peripheral bus, and a local bus using any of a variety of bus architectures. The system memory includes read-only memory (ROM) 1924 and random access memory (RAM) 1925. A basic input/output system 1926 (BIOS), containing the basic routines that help to transfer information between elements within the computer 1920, such as during start-up, is stored in ROM 1924.

The computer 1920 may further include a hard disk drive 1927 for reading from and writing to a hard disk (not shown), a magnetic disk drive 1928 for reading from or writing to a removable magnetic disk 1929, and an optical disk drive 1930 for reading from or writing to a removable optical disk 1931 such as a CD-ROM or other optical media. The hard disk drive 1927, magnetic disk drive 1928, and optical disk drive 1930 are connected to the system bus 1923 by a hard disk drive interface 1932, a magnetic disk drive interface 1933, and an optical drive interface 1934, respectively. The drives and their associated computer-readable media provide non-volatile storage of computer readable instructions, data structures, program modules and other data for the computer 1920. As described herein, computer-readable media is a tangible, physical, and concrete article of manufacture and thus not a signal per se.

Although the exemplary environment described herein employs a hard disk, a removable magnetic disk 1929, and a removable optical disk 1931, it should be appreciated that other types of computer readable media which can store data that is accessible by a computer may also be used in the exemplary operating environment. Such other types of media include, but are not limited to, a magnetic cassette, a flash memory card, a digital video or versatile disk, a Bernoulli cartridge, a random access memory (RAM), a read-only memory (ROM), and the like.

A number of program modules may be stored on the hard disk, magnetic disk 1929, optical disk 1931, ROM 1924 or RAM 1925, including an operating system 1935, one or more application programs 1936, other program modules 1937 and program data 1938. A user may enter commands and information into the computer 1920 through input devices such as a keyboard 1940 and pointing device 1942. Other input devices (not shown) may include a microphone, joystick, game pad, satellite disk, scanner, or the like. These and other input devices are often connected to the processing unit 1921 through a serial port interface 1946 that is coupled to the system bus, but may be connected by other interfaces, such as a parallel port, game port, or universal serial bus (USB). A monitor 1947 or other type of display device is also connected to the system bus 1923 via an interface, such as a video adapter 1948. In addition to the monitor 1947, a computer may include other peripheral output devices (not shown), such as speakers and printers. The exemplary system of FIG. 19 also includes a host adapter 1955, a Small Computer System Interface (SCSI) bus 1956, and an external storage device 1962 connected to the SCSI bus 1956.

The computer 1920 may operate in a networked environment using logical connections to one or more remote computers, such as a remote computer 1949. The remote computer 1949 may be a personal computer, a server, a router, a network PC, a peer device or other common network node, and may include many or all of the elements described above relative to the computer 1920, although only a memory storage device 1950 has been illustrated in FIG. 19. The logical connections depicted in FIG. 19 include a local area network (LAN) 1951 and a wide area network (WAN) 1952. Such networking environments are commonplace in offices, enterprise-wide computer networks, intranets, and the Internet.

When used in a LAN networking environment, the computer 1920 is connected to the LAN 1951 through a network interface or adapter 1953. When used in a WAN networking environment, the computer 1920 may include a modem 1954 or other means for establishing communications over the wide area network 1952, such as the Internet. The modem 1954, which may be internal or external, is connected to the system bus 1923 via the serial port interface 1946. In a networked environment, program modules depicted relative to the computer 1920, or portions thereof, may be stored in the remote memory storage device. It will be appreciated that the network connections shown are exemplary and other means of establishing a communications link between the computers may be used.

Computer 1920 may include a variety of computer readable storage media. Computer readable storage media can be any available media that can be accessed by computer 1920 and includes both volatile and nonvolatile media, removable and non-removable media. By way of example, and not limitation, computer readable media may comprise computer storage media and communication media. Computer storage media include both volatile and nonvolatile, removable and non-removable media implemented in any method or technology for storage of information such as computer readable instructions, data structures, program modules or other data. Computer storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 1920. Combinations of any of the above should also be included within the scope of computer readable media that may be used to store source code for implementing the methods and systems described herein. Any combination of the features or elements disclosed herein may be used in one or more embodiments.

In describing preferred embodiments of the subject matter of the present disclosure, as illustrated in the Figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose. Although integral spacers are discussed to be attached at the end of the lamination, the integral spacer may be placed in any area of the lamination that will eventually cause stacking issues related to a parallelism error without the spacers. Mill coating may be considered the coating applied when the steel mill plant rolls the sheet. Precoating may be considered the coat applied on the coil before punching, while recoating may be considered the coat applied on the lamination after punching. Polymer or organic coating may be applied in different processes. For example, wet (e.g., liquid) resin application or powder application. Both get cured and leveled under high temperature. The resin of these insulation coatings may be filled with inorganic particles.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:

1. An apparatus comprising:
    a lamination having a variable thickness; and
    a spacer connected with the lamination at a first location, wherein the location of the spacer is based on a determined inconsistent thickness of the lamination that causes a parallelism error on the lamination.

2. The apparatus of claim 1, wherein the spacer comprises a polymer.

3. The apparatus of claim 2, wherein the polymer comprises at least one of polyurethane, polyester, phenolics, polyimide, or enamel.

4. The apparatus of claim 1, wherein the spacer comprises at least one of:
    alumina, zirconia, silicate, or other inorganic filler.

5. The apparatus of claim 1, wherein the location on the lamination is at least one of: a length-wise top edge or a length-wise bottom edge of the lamination.

6. The apparatus of claim 1, wherein the location on a lamination coincides with at least one of a dovetail area of the lamination or a tooth area of the lamination.

7. The apparatus of claim 1, wherein the spacer has a variable thickness.

8. The apparatus of claim 1, further comprising:
    a second side spacer connected with the lamination at a second location on a second side that is opposite the first location of the spacer, wherein the second location of the second side spacer is based on a thickness of the lamination.

9. The apparatus of claim 1, wherein the spacer has a thickness based on the determined inconsistent thickness of the lamination to correct the parallelism error on the lamination.

10. The apparatus of claim 1, wherein the spacer is one of a plurality of spacers each connected with a plurality of laminations, the spacer contributing to an approximately level stacking of the plurality of laminations.

* * * * *